United States Patent [19]

Takahashi

[11] Patent Number: 5,502,677
[45] Date of Patent: Mar. 26, 1996

[54] SEMICONDUCTOR MEMORY DEVICE INCORPORATING A TEST MODE THEREIN TO PERFORM AN AUTOMATIC REFRESH FUNCTION

[75] Inventor: Shinya Takahashi, Tokyo, Japan

[73] Assignee: Oki Electric Industry Co., Ltd., Tokyo, Japan

[21] Appl. No.: 253,773

[22] Filed: Jun. 3, 1994

[30] Foreign Application Priority Data

Jun. 15, 1993 [JP] Japan .................. 5-143354

[51] Int. Cl.$^6$ .................. G11C 13/00
[52] U.S. Cl. .......... 365/201; 365/222; 365/189.04
[58] Field of Search .................. 365/201, 222, 365/189.01, 189.04

[56] References Cited

U.S. PATENT DOCUMENTS 5,161,120  11/1992  Kajimoto et al. .

5,416,740  5/1995  Fujita et al. .................. 365/201

FOREIGN PATENT DOCUMENTS 0585870  3/1994  European Pat. Off. .
63-148493  6/1988  Japan .

*Primary Examiner*—Terrell W. Fears
*Attorney, Agent, or Firm*—Steven M. Rabin; Allen Wood

[57] ABSTRACT

There is provided a switch 140 between an address line 121 and external output terminals A0~An, controlled by outputs of a counter circuit 117 and a test mode control circuit 119. The switch 140 transfers a variation of an address signal to external output terminals A0~An, without connecting the address line 121 with the external address terminals A0~An, directly.

11 Claims, 6 Drawing Sheets

SEMICONDUCTOR MEMORY DEVICE INCORPORATING A TEST MODE THEREIN TO PERFORM AN AUTOMATIC REFRESH FUNCTION

REFERENCE TO RELATED APPLICATION

This application claims the priority right under 35 U.S.C 119, of Japanese Patent Application No. Hei 05-143354 filed on Jun. 15, 1993, the entire disclosure of which is incorporated herein by reference.

BACKGROUND OF THE INVENTION

1. Field of the Invention

The present invention relates to a semiconductor memory device and, more particularly, to a semiconductor memory device incorporating a test mode therein to perform an automatic refresh function.

2. Description of the Related Art

Described below is a general operation of the test mode for measuring a refresh period of DRAM employing the automatic refresh function.

First, an internal address counter counts an oscillation number of an oscillation signal generated by an oscillator which determines the refresh period and outputs the result into an address terminal. Then, judgement is made as to whether the automatic refresh function has been correctly operated by measuring the result output onto the address terminal.

However, there arise the following problems in the DRAM employing the test mode function set forth above when the test circuit operates under a normal operation mode or an automatic refresh operation mode, that is, when a test mode control signal is set to be a Low level.

Namely, when levels of external address signals become below a ground potential level GND due to undershoot or the like, or when the level of the test mode control signal exceeds above the ground potential level GND due to superimposition of noises upon the test mode control signal caused by an operational noise in a circuit, data of the external address signal affects on data output as a refresh address.

As the result, there arise problems that a counter circuit may malfunction or defects may be generated upon continuity of the refresh address.

These kinds of semiconductor memory devices are disclosed, for example, in Japanese Laid-Open Patent Publication 63-148493.

SUMMARY OF THE INVENTION

It is a primary object of the present invention to provide a semiconductor memory device which can accurately output contents of the refresh address output from the counter circuit without any influence on the refresh address even when an excessive negative potential is applied to an external terminal or when noises are superimposed on the test mode control signal for some reason, by employing a configuration where the address lines are not connected directly with the external terminals.

To accomplish the above object, there is provided, according to the present invention, a semiconductor memory device having an automatic refresh function and a test mode for measuring a refresh period, having:

(a) an automatic refresh control circuit for shifting a potential of a first node from a first logic level to a second logic level on detection of change-over to an automatic refresh mode;

(b) a refresh signal generation circuit for refreshing an internal circuit by shifting a potential of a second node from the first logic level to the second logic level after a lapse of prescribed time from the potential of the first node being shifted from the first logic level to the second logic level;

(c) a counter circuit for renewing data stored therein and outputting an address signal having either the first logic level or the second logic level when the potential of the second node shifts from the first logic level to the second logic level;

(d) a switch circuit for informing a potential state of an address signal terminal by setting the address signal terminal to either a first state or a second state in response to a content of the address signal output from the counter circuit when the test mode is instructed; and (e) an address signal input circuit for outputting the address signal fed through the address signal terminal when the potential of the first node reveals the first logic level and for outputting the address signal fed through the counter circuit when the potential of the first node reveals the second logic level.

According to another aspect of the present invention, there is provided a switch circuit for informing an external terminal of variation of a signal passing through a signal line connected thereto, in response to a control signal having:

(a) a first MOS transistor having a source, a gate and a drain, the source and the gate being connected with the external terminal and the signal line, respectively; and (b) a second MOS transistor having a source, a gate and a drain, the source and the drain being connected with the drain of the first MOS transistor and a ground source having a ground potential, respectively, the gate applied to the control signal;

whereby the second MOS transistor turns "on" when the gate of the second MOS transistor receives the control signal revealing variation of the signal and the first MOS transistor turns "on" or "off" in response to a logic level of the signal so that the variation of the signal is informed by having the external terminal set to either the ground potential or a high impedance state.

The present invention provides a switch, between the address lines and the external output terminals, controlled by the outputs of the counter circuit and the test mode control circuit, whereby the switch prevents the address lines from being connected directly with the external address terminal.

DETAILED DESCRIPTION OF THE PREFERRED EMBODIMENTS

Hereinafter, explanation will be made as to the embodiment of the semiconductor memory device employing a test mode performing an automatic refresh function according to the present invention with reference to appended drawings.

Figure 1:
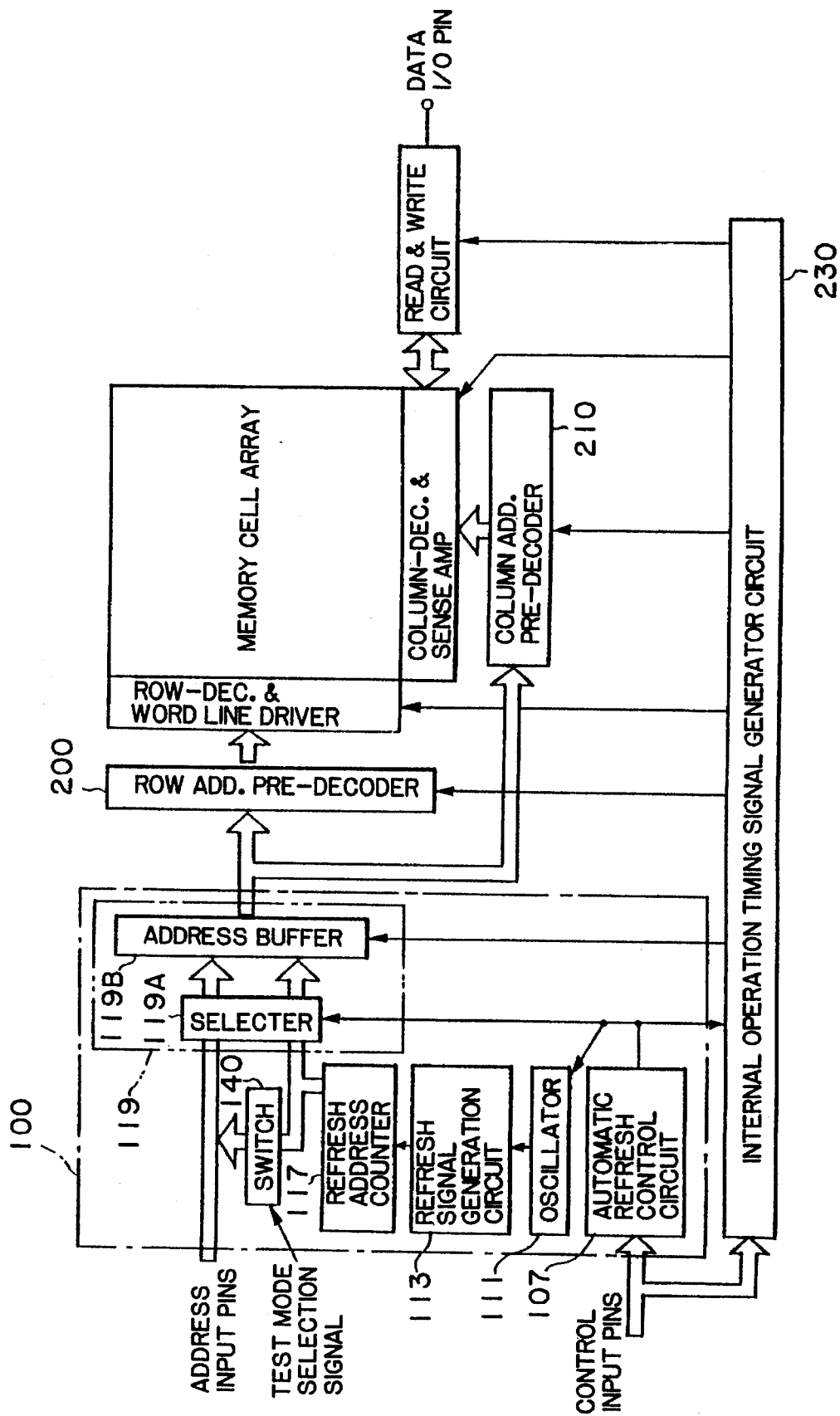
FIG. 1 is a block diagram illustrating an embodiment, in which a semiconductor memory device employing a test mode performing an automatic refresh function according to the present invention is applied to a DRAM.

FIG. 1 is a block diagram illustrating an embodiment, in which the present invention is applied to a DRAM.

Figure 2:
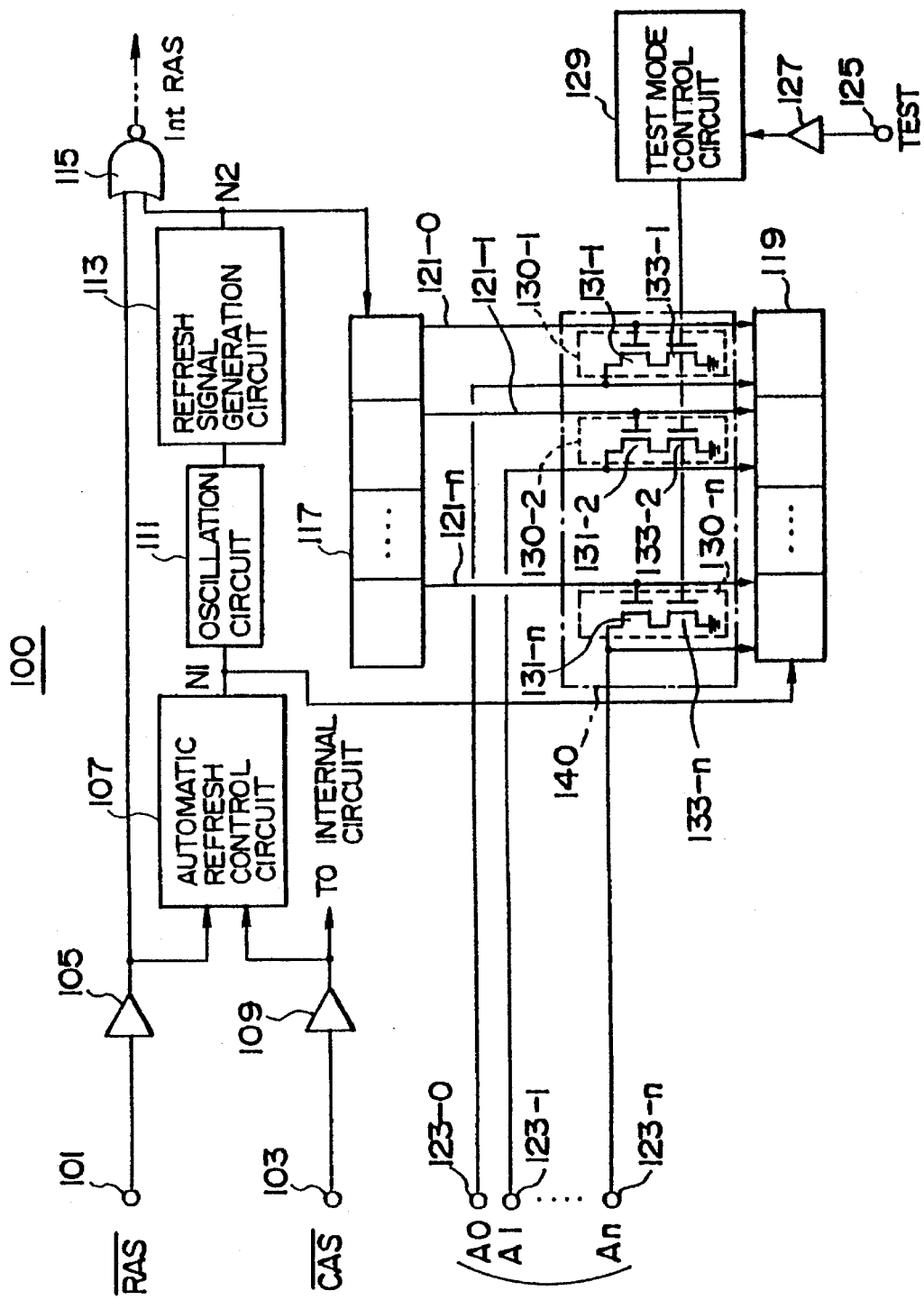
FIG. 2 is a block diagram illustrating an embodiment of an automatic refresh circuit employing a test mode.

The DRAM shown in FIG. 1 employs an automatic refresh circuit 100 incorporating a test mode therein. The automatic refresh circuit 100 outputs an address signal transferred through an address input terminal to a row address pre-decoder 200 and a column address predecoder 210, and also outputs a refresh address to the row address pre-decoder 200 and the column address predecoder 210 as well when an automatic refresh operation is instructed by a row address strobe signal and a column address signal (hereinafter referred as $\overline{RAS}$ and $\overline{CAS}$, respectively) transferred through a control signal input terminal. The automatic refresh circuit 100 further outputs the refresh address on the address input terminal when a test mode selection signal is input which tests whether or not the automatic refresh function is correctly operated. FIG. 2 is a block diagram of the automatic refresh circuit 100 shown in FIG. 1.

A circuit 100 incorporates therein an external input terminal 101 through which a $\overline{RAS}$ is provided and an external input terminal 103 through which $\overline{CAS}$ is provided. $\overline{RAS}$ provided through the external input terminal 101 is input to an input circuit 105. The input circuit 105 outputs an output signal in response to $\overline{RAS}$ to an automatic refresh control circuit 107. $\overline{CAS}$ provided through the external input terminal 103 is input to an input circuit 109. The input circuit 109 outputs an output signal in response to $\overline{CAS}$ to the automatic refresh control circuit 107 and a timing generation circuit 230 for internal operation (see FIG. 1).

The automatic refresh control circuit 107 outputs a control signal through a node N1 in response to the output signals from the input circuits 105 and 109 to an oscillation circuit 111 and an address signal input circuit 119, whereby the automatic refresh function is initiated.

The oscillation circuit 111 oscillates a clock signal, which determines a refresh period, in response to the control signal and outputs the clock signal to a refresh signal generation circuit 113.

The refresh signal generation circuit 113 outputs a refresh signal for refresh operation through a node N2 in response to the clock signal to a NOR circuit 115 and a counter circuit 117.

The NOR circuit 115 outputs an internal row address strobe (hereinafter referred as Int RAS) which is an instruction signal for commencing substantive operations of the DRAM circuit to the timing generation circuit 230 (see FIG. 1) in response to the output signal output from the input circuit 105 and the refresh signal.

The counter circuit 117 outputs a refresh address through address lines 121 in response to the refresh signal to an address signal input circuit 119.

The address signal input circuit 119 receives either external address signals A0~An through external input terminals 123-0~123-n or the refresh address from the counter circuit 117.

In a test mode of this automatic refresh circuit 100, a test signal TEST is input through a test signal input terminal 125 to a test signal input circuit 127. The test signal input circuit 127 outputs an output signal in response to the test signal TEST to a test mode control circuit 129. The test mode control circuit 129 is a change-over circuit for changing over between a normal operation mode and the test mode, and outputs a test mode control signal in response to the output signal from the test signal input circuit.

The automatic refresh circuit 100 further incorporates a plurality of mode selection circuits 130 corresponding to each address line controlled by the test mode control signal and the refresh address signal between the external input terminals 123-0~123-n and the address lines 121-0~121-n. The mode selection circuit 130 is utilized in the test mode for outputting data corresponding to data output by the counter circuit 117 on the external input terminal 123. In this embodiments, these mode selection circuits 130-1~130-n constitutes a switch 140.

In the present embodiment, the mode selection circuit 130 is constituted of an NMOS 131 and NMOS 133. A gate electrode, a drain electrode and a source electrode of the NMOS 131 are respectively connected with the address line 121, the external input terminal 123 and a drain electrode of the NMOS 133. A gate electrode, a drain electrode and a source electrode of the NMOS 133 are respectively connected with the test mode control circuit 129, the source electrode of the NMOS 131 and the ground source potential GND.

The semiconductor memory circuit described above sets, under the normal operation mode (read out, write in and automatic refresh operations) the test mode control signal output from the test mode control circuit 129 to be the first logic level (Low level) so that the NMOS 133 stays under off-state. In this instance, the NMOS 133 maintains the off-state when a potential on the external input terminal 123 exceeds Vt (vt is a threshold voltage of the NMOS 131) notwithstanding the logic level of the refresh address signal provided at the gate electrode of the NMOS 131.

If, in this instance, an excessive negative potential below −Vt is applied to the external input terminal 123, the NMOS 133 turns to be on-state so that the external input terminal 123 is connected with the ground source potential GND, which, however, does not affect the refresh address output from the counter circuit 117.

Even though the NMOS 133 turns to be on-state on the ground that noises are superimposed for some reason on the test mode control signal output from the test mode control circuit 129, the refresh address output from the counter circuit 117 cannot be affected because the external input terminal 123 is connected with the ground source potential GND.

Next, when the test mode is selected by the test mode control signal output from the test mode control circuit 129 setting to be the second logic level (High level), the NMOS 133 turns to be on-state and the NMOS 133-0~133-n turn to be on or off-state depending on the respective states of the address lines 121-0~121-n in response to the refresh address output from the counter circuit 117.

In this instance, for example, when the NMOS 131-n stays under on-state, that is, when the refresh address signal provided to the address line 121-n stays under the second logic level (High level), the external input terminal 123-n is connected with the ground source potential GND through the NMOS 131-n and the NMOS 133-n so that a leak current is generated at the external input terminal 123-n. By measuring the leak current, the logic level of the address line 121-n, that is, output condition of the counter circuit 117 can be judged externally.

When the NMOS 131-n stays under off-state, that is, when the refresh address signal provided to the address line 121-n stays under the first logic level (Low level), the external input terminal 123-n reveals high impedance state so that the leak current is not generated.

Similarly, the refresh address output from the counter circuit can be accurately detected by measuring with a measuring circuit (not shown) the potential state on the external input terminals 123-0~123-n, that is, the existence of the leak current.

Figure 4:
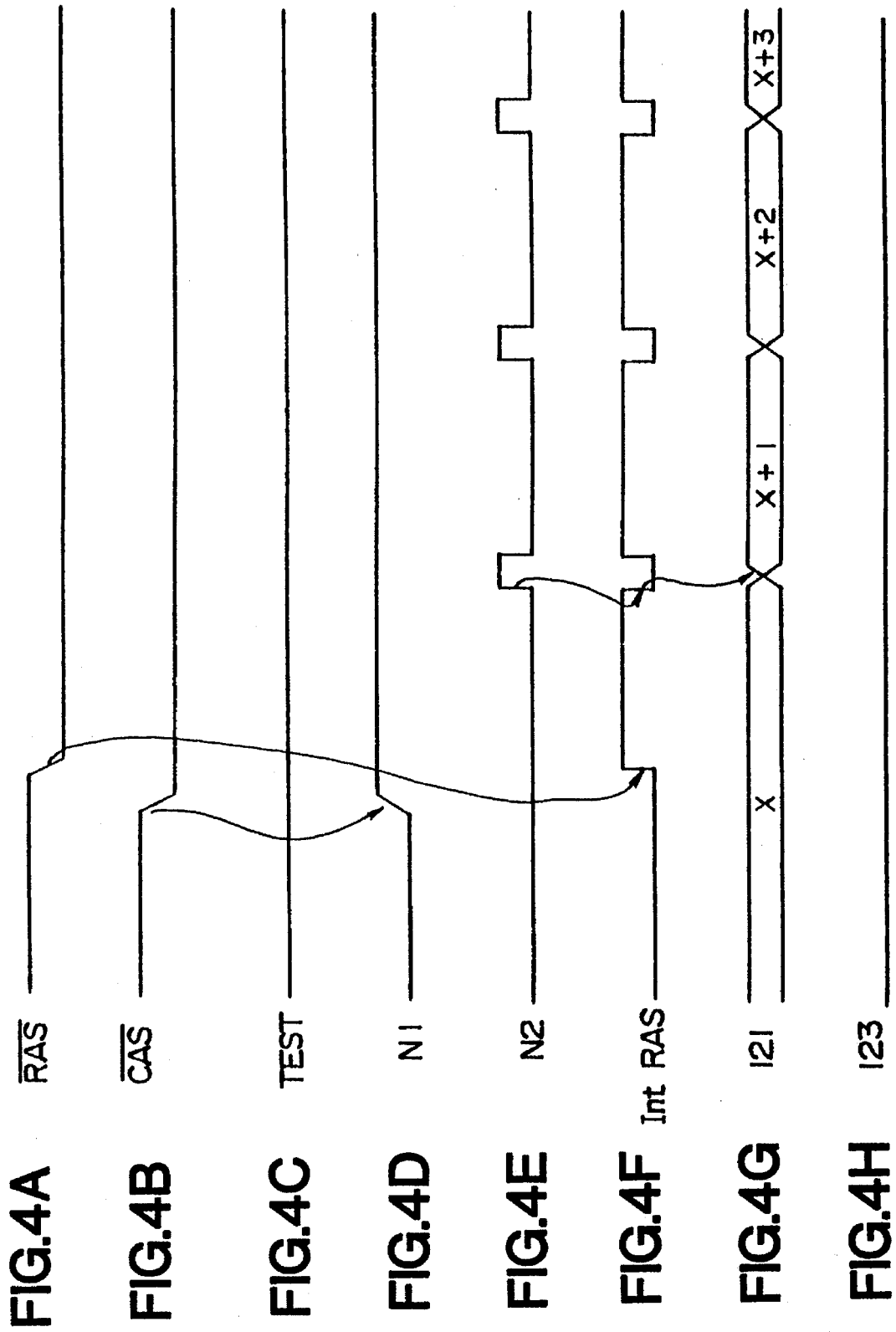
FIG. 4 is a timing chart describing a normal mode operation of the embodiment shown in FIG. 2.
Figure 5:
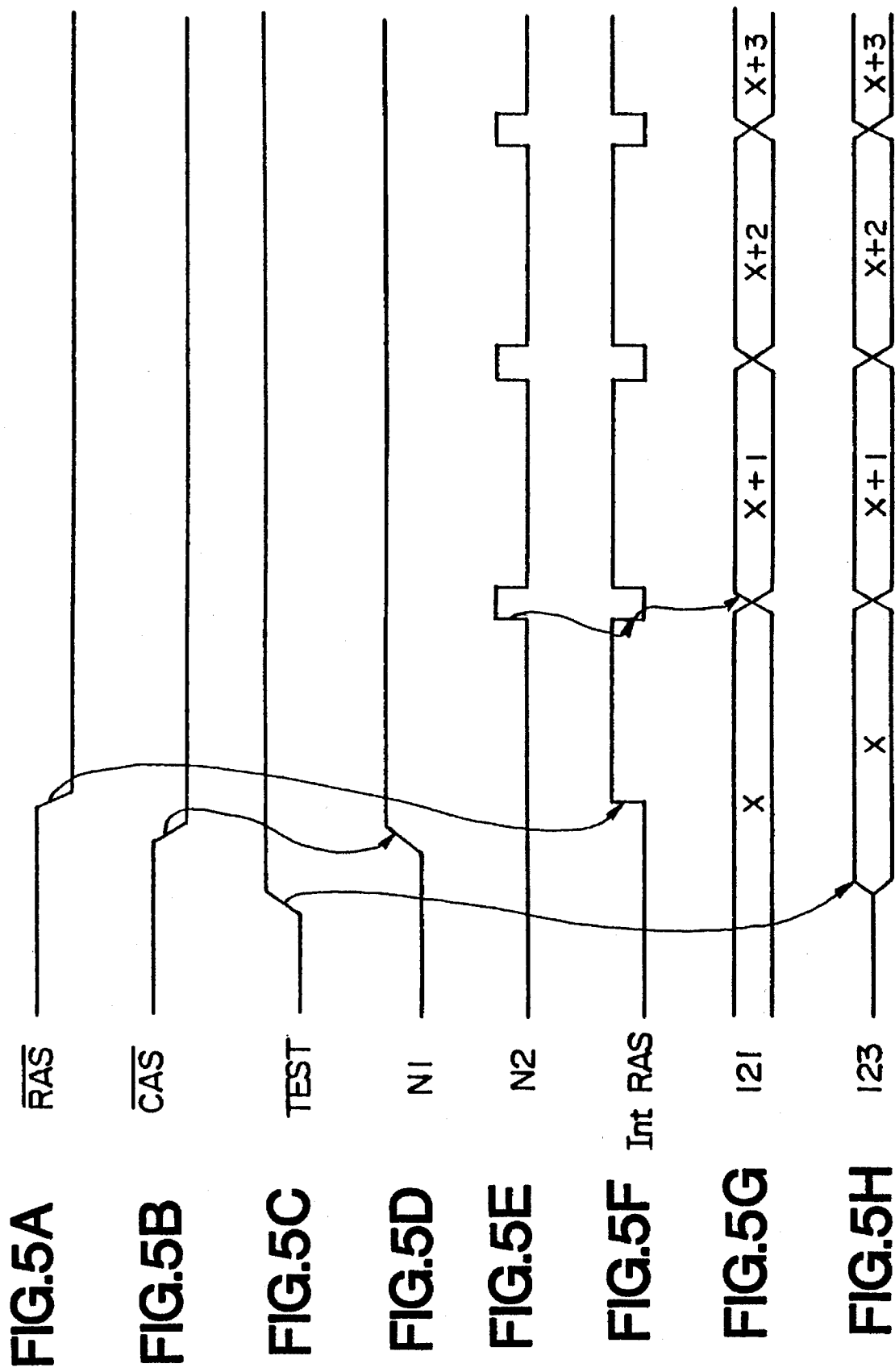
FIG. 5 is a timing chart describing a test mode operation of the embodiment shown in FIG. 2.

Now, explanation is made hereinbelow as to the operation of the test circuit 100 with reference to FIGS. 4 and 5. FIG. 4 is a view illustrating a timing chart when the automatic refresh operation is performed. In this instance, assumption is made that data stored in the counter circuit 217 prior to the automatic refresh operation has been stored at X address.

First, when $\overline{CAS}$ falls down before $\overline{RAS}$ falls down, the automatic refresh control circuit 107 is changed over from the normal operation mode (write in or read out mode) to the automatic refresh mode, whereby a level of the control signal output to the node N1 from the automatic refresh control circuit 107 shifts from the first logic level (Low level) to the second logic level (High level).

In response to the control signal being shifted to the second logic level, the oscillation circuit 111 oscillates the clock signal and outputs it to the refresh signal generation circuit 113. Concurrently, the input of the address signal input circuit 119 is changed over from the external address signals A0~An to the refresh address.

Then, in response to $\overline{RAS}$ being transferred from the second logic level (High level) to the first logic level (Low level), the NOR circuit 115 outputs the Int RAS to the timing generation circuit 230 for internal operation (see FIG. 1). The Int RAS represents the instruction signal to the DRAM circuit for initiating the refresh operation.

With the lapse of time for a predetermined period since the oscillation circuit 111 initiated oscillation, the level of the refresh signal output from the refresh signal generation circuit 113 to the node N2 is transferred from the first logic level to the second logic level. In response to the transfer, Int RAS is reset (transferred from the second logic level to the first logic level) so that the internal circuit becomes from a refresh operation state to a standing by state. Further, in response to the transfer of the level of the refresh signal, the counter circuit 117 renews the data stored therein from X address to X+1 address and becomes the standing state until when the commence instruction for the next refresh operation is received.

Next, when the level of the refresh signal is transferred from the second logic level to the first logic level, the internal circuit becomes the refresh operation state again.

By repetition of the above mentioned operation, the entire memory cells can be successively refreshed. Under the refresh mode, the external input terminal 123 reveals high impedance state.

Further, explanation will be made hereunder as to the operation in the test mode referring to the timing chart shown in FIG. 5.

The test mode is determined and the test mode operation is initiated by transferring the level of the test signal TEST provided to the test signal input terminal 125 from the first logic level (Low level) to the second logic level (High level).

When the test signal TEST is transferred to the second logic level, the test signal input circuit 127 outputs the output signal in response to the test signal TEST. Then, the test mode control circuit 129 outputs the test mode control signal with the second logic level (High level) in response to the output signal. In response to the test mode control signal, the NMOS 131 turns "on", whereby a leak current flows through the terminal 123 when the data output from the counter 117 reveals the second logic level (High level) because the external input terminal 123 is connected with the ground source potential GND, and no leak current flows through the terminal 123 when the data output from the counter 117 reveals the first logic level (Low level) because the external input terminal 123 reveals high impedance state. Therefore, judgement as to whether the automatic refresh function has been adequately operated can be made from outside of the IC by measuring the leak current through the external input terminal 123.

Figure 3:
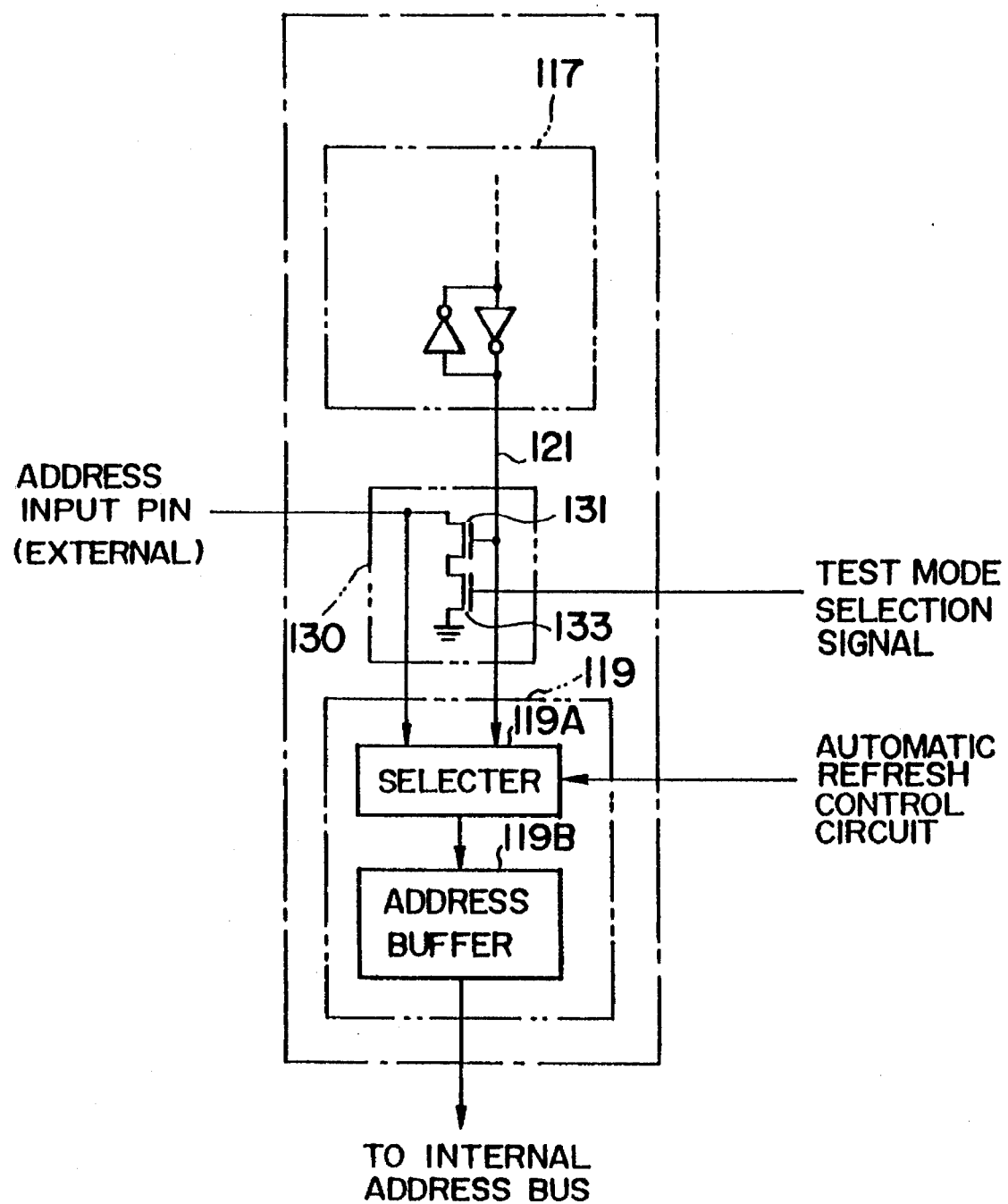
FIG. 3 is an address control block diagram for one bit in the automatic refresh circuit shown in FIGS. 1 and 2.

FIG. 3 is an address control block diagram for one bit in FIG. 2 employing a switch 130. As clearly understood from FIG. 3, even though the switch 131 malfunctions due to noises superimposed on the automatic refresh control signal, the address signal 121 cannot be affected because the address signal 121 of the refresh address counter 117 is electrically isolated by the switches 131 and 133. Moreover, even if the potential of the external input terminal becomes negative voltage due to reflection of signals or the like, no rush current flows and no electrical affect is caused because the signal from the refresh address counter is isolated from the external input terminal under direct current (DC) basis.

Although the mode selection circuit 130 in the present embodiment shown in FIG. 2 and 3 is constituted of two NMOS transistors, the similar circuit can be realized by employing P channel type MOS transistors.

Figure 6:
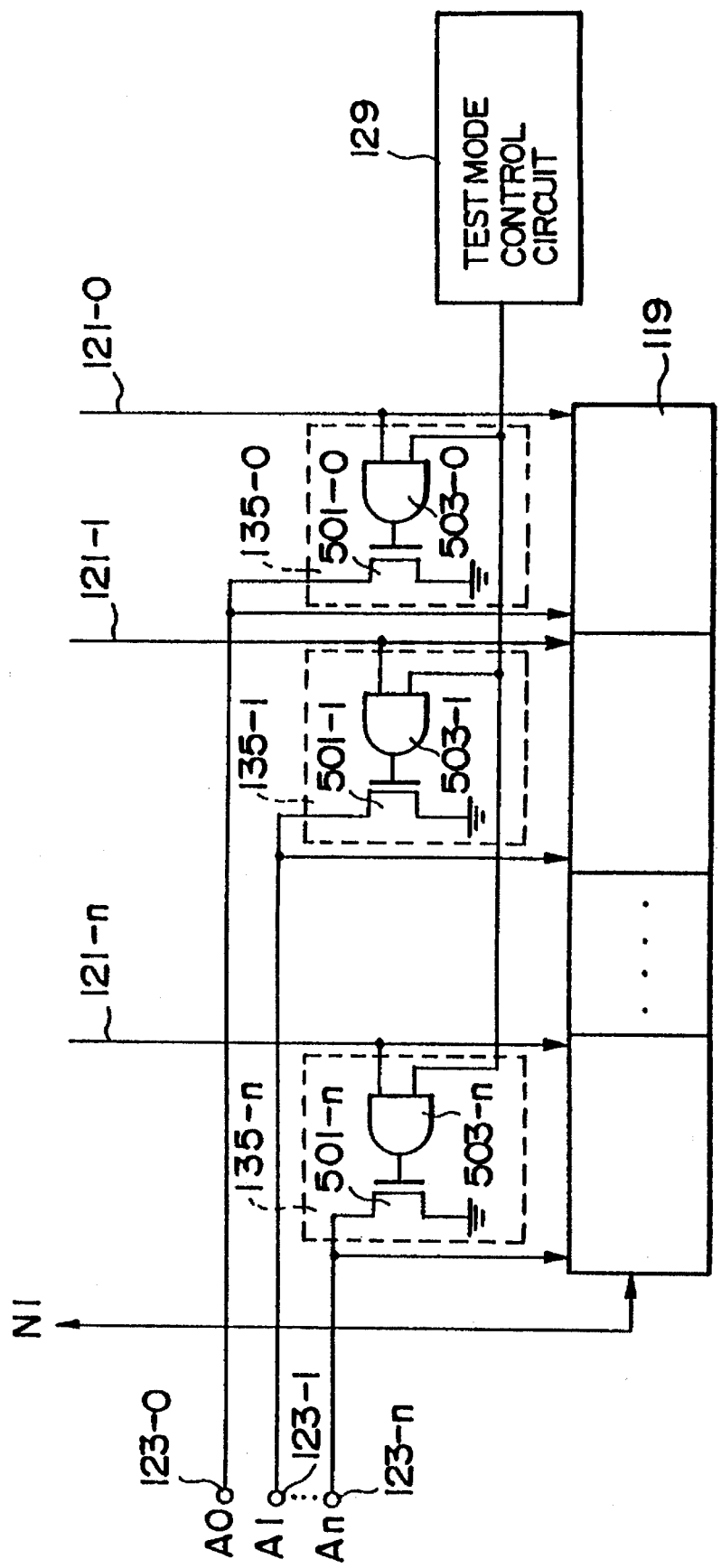
FIG. 6 is a block diagram illustrating another embodiment of the automatic refresh circuit employing a test mode.

The other circuit configuration of the mode selection circuit is shown in FIG. 6, where identical parts shown in FIG. 2 bear identical reference numerals, explanation of which is omitted.

The mode selection circuit 135 in this embodiment is constituted of an NMOS 501 and an AND circuit 503.

A drain electrode, a source electrode and a gate electrode of the NMOS 501 are connected with the external input terminal 123, the ground source potential GND and an output of the AND circuit 503, respectively. One input of the AND circuit 503 is connected with the address line 121, whereas the other input is connected with the test mode control circuit 129.

This embodiment also employs a configuration, in which judgement can be made externally from the IC as to whether the automatic refresh function is adequately operated by measuring the leak current so that the operation is substantially the same as that of the aforementioned embodiment.

In the present embodiment, although the semiconductor memory device according to the present invention is applied to a DRAM, the invention is not restricted to be applied to the DRAM but can be widely applied to the semiconductor memory device such as a pseudo SRAM which requires a refresh operation.

Since the present invention provides the mode selection circuit controlled by the outputs of the counter circuit and the test mode control circuit between the address line and the external output terminal, the address line cannot be directly connected with the external input terminal even though (1) an excessive negative potential below −Vt is applied to the external input terminal or (2) noises are generated for some reason on the test mode control signal.

Accordingly, there can be provided the test circuit which does not disturb the external input terminal or the refresh address output from the counter circuit.

Further, the content of the refresh address output from the counter circuit in the test mode can be accurately output on the external output terminal so that the condition of the automatic refresh operation can be precisely checked.

What is claimed is:

1. A semiconductor memory device having an automatic refresh function and a test mode for measuring a refresh period, comprising:
   (a) an automatic refresh control circuit for shifting a potential of a first node from a first logic level to a second logic level on detection of change-over to an automatic refresh mode;
   (b) a refresh signal generation circuit for refreshing an internal circuit by shifting a potential of a second node from the first logic level to the second logic level after a lapse of prescribed time from the potential of the first node being shifted from the first logic level to the second logic level;
   (c) a counter circuit for renewing data stored therein and outputting an address signal having either the first logic level or the second logic level when the potential of the second node shifts from the first logic level to the second logic level;
   (d) a switch circuit for informing a potential state of an address signal terminal by setting the address signal terminal to either a first state or a second state in response to a content of the address signal output from the counter circuit when the test mode is instructed; and
   (e) an address signal input circuit for outputting the address signal fed through the address signal terminal when the potential of the first node reveals the first logic level and for outputting the address signal fed through the counter circuit when the potential of the first node reveals the second logic level.

2. A semiconductor memory device in accordance with claim 1, wherein the first state and the second state of the switch circuit are a low impedance state and a high impedance state, respectively.

3. A semiconductor memory device in accordance with claim 1, wherein the switch circuit is constituted of a plurality of mode selection circuits provided in correspondence with each of address signal lines for inputting the address signal from the counter circuit.

4. A semiconductor memory device in accordance with claim 3, wherein the mode selection circuit further comprises:
   (a) a first MOS transistor having a source, a gate and a drain; the source and the gate being connected with the address signal terminal and an input terminal through which the test mode signal is input, respectively; and
   (b) a second MOS transistor having a source, a gate and a drain; the source, the gate and the drain being connected with the drain of the first MOS transistor, the address signal line through which the address signal from the counter circuit is input and a ground source having a ground potential, respectively.

5. A semiconductor memory device in accordance with claim 4, wherein the first MOS transistor of the mode selection circuit is constituted of either an NPN transistor or a PMOS transistor.

6. A semiconductor memory device in accordance with claim 4, wherein the second MOS transistor of the mode selection circuit is constituted of an NMOS transistor when the test mode signal reveals a high level.

7. A semiconductor memory device in accordance with claim 4, wherein the second MOS transistor of the mode selection circuit is constituted of a PMOS transistor when the test mode signal reveals a low level.

8. A semiconductor memory device in accordance with claim 4, wherein the mode selection circuit further comprises:
   (a) a logic gate having a first input terminal, a second input terminal and an output terminal; the first and second input terminals being connected with the address signal line through which the address signal from the counter circuit and an input terminal through which the test mode signal is input, respectively; and
   (b) a third MOS transistor having a source, a gate and a drain; the source, the gate and the drain being connected with the address signal terminal, the output terminal and a ground source having a ground potential, respectively.

9. A semiconductor memory device in accordance with claim 8, wherein the logic circuit is an AND gate, and the third MOS transistor is an NMOS transistor.

10. A semiconductor memory device in accordance with claim 8, wherein the logic circuit is a NAND gate, and the third MOS transistor is a PMOS transistor.

11. A switch circuit for informing an external terminal of variation of a signal passing through a signal line connected thereto, in response to a control signal comprising:
    (a) a first MOS transistor having a source, a gate and a drain, the source and the gate being connected with the external terminal and the signal line, respectively; and
    (b) a second MOS transistor having a source, a gate and a drain, the source and the drain being connected with the drain of the first MOS transistor and a ground source having a ground potential, respectively the gate applied to the control signal;
    whereby the second MOS transistor turns "on" when the gate of the second MOS transistor receives the control signal revealing variation of the signal and the first MOS transistor turns "on" or "off" in response to a logic level of the signal so that the variation of the signal is informed by having the external terminal set to either the ground potential or a high impedance state.

* * * * *